US 10,468,463 B1

(12) United States Patent
Chen

(10) Patent No.: US 10,468,463 B1
(45) Date of Patent: Nov. 5, 2019

(54) DISPLAY DEVICE WITH OPTICAL REFLECTING LAYER

(71) Applicant: Facebook Technologies, LLC, Menlo Park, CA (US)

(72) Inventor: Dong Chen, Suzhou (CN)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/842,483

(22) Filed: Dec. 14, 2017

(51) Int. Cl.
*H01L 29/08* (2006.01)
*H01L 27/32* (2006.01)
*H01L 51/52* (2006.01)

(52) U.S. Cl.
CPC ...... *H01L 27/3225* (2013.01); *H01L 27/3211* (2013.01); *H01L 51/5271* (2013.01); *H01L 2227/32* (2013.01)

(58) Field of Classification Search
CPC . H01L 27/32; H01L 27/3225; H01L 27/3211; H01L 51/5271; H01L 2227/32
See application file for complete search history.

(56) References Cited

U.S. PATENT DOCUMENTS

| 2008/0303071 | A1* | 12/2008 | Hong | H01L 27/1463 257/292 |
| 2014/0183478 | A1* | 7/2014 | Lee | H01L 51/56 257/40 |
| 2016/0226029 | A1* | 8/2016 | Lee | H01L 51/5275 |
| 2016/0299377 | A1* | 10/2016 | Choi | G02F 1/133377 |

* cited by examiner

*Primary Examiner* — Phuc T Dang
(74) *Attorney, Agent, or Firm* — Fenwick & West LLP

(57) ABSTRACT

A display device including a lower structure with a substrate and organic light emitting diode (OLED) pixels and an upper structure with a cover glass, overcoat layer, and a reflective layer. The upper structure is adjoined to the lower structure. The cover glass includes a viewing surface of the display device and covers the OLED pixels. The OLED pixels emit light towards the viewing surface of the display device. An overcoat layer on the cover glass is on a surface opposite to the viewing surface. The reflective layer on the overcoat layer reflects light emitted from the OLED pixels towards the viewing surface.

13 Claims, 5 Drawing Sheets

DISPLAY DEVICE WITH OPTICAL REFLECTING LAYER

BACKGROUND

This disclosure relates generally to display devices, in particular to improving light extraction for display devices.

Head-mounted displays (HMDs) can include an electronic display such as an Organic Light Emitting Diode (OLED) display. One problem with using electronic displays in an HMD is the screen door effect, in which non-emissive areas separating subpixels or pixels of a display device become visible in the displayed image. In an OLED display, there is significant loss in light extraction from the OLED pixels due to optical properties of layers used to form an OLED display such as organic material, a cover glass, and air. For example, the index of refraction of organic material is greater than index of refraction of the cover glass which is greater than the index of refraction of air. When light from an emitting layer of the organic material is incident on the cover glass at a shallow angle to the surface of the cover glass, the light may experience total internal reflection at an interface between the organic material and cover glass surface or at an interface between the cover glass and air. Thus, this light is reflected back towards the organic material and does not exit out of the OLED display. As such, this light is wasted and does not contribute to improving the efficiency of the display.

SUMMARY

Embodiments relate to a display device including a display panel with pixels and a cover glass with a reflective layer to improve light extraction for the display device. The cover glass includes an overcoat layer with holes and the reflective layer formed in the holes to reflect light emitted from the pixels towards a viewing surface of the display device.

In one embodiment, a display device includes a lower structure with a substrate and organic light emitting diode (OLED) pixels and an upper structure with a cover glass, overcoat layer, and a reflective layer. The upper structure is adjoined to the lower structure. The cover glass includes the viewing surface of the display device and covers the OLED pixels. The OLED pixels emit light towards the viewing surface of the display device. An overcoat layer on the cover glass is on a surface opposite to the viewing surface. The reflective layer on the overcoat layer reflects light emitted from the OLED pixels towards the viewing surface.

In one embodiment, the overcoat layer includes holes and the reflective layer is formed in the holes. An angle at which a side surface of each of the holes meets a surface of the overcoat layer may be between 60 to 80 degrees.

In one embodiment, the overcoat layer may be coupled directly to the plurality of OLED pixels. Alternatively, the overcoat layer may be separated by an air gap from the plurality of OLED pixels. The lower structure further may include a plurality of microlenses on the plurality of OLED pixels.

Figure 1:
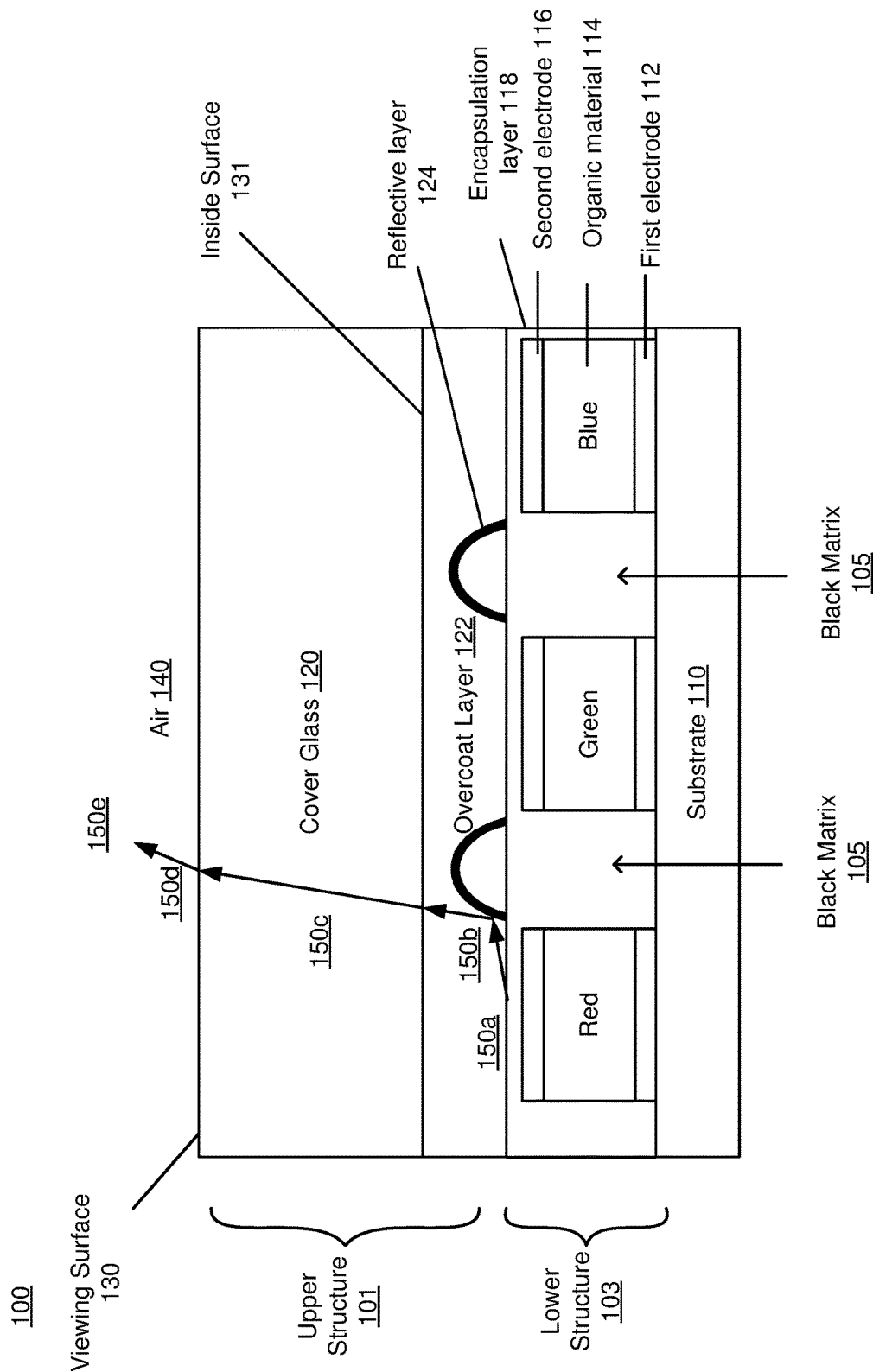
FIG. 1 is a cross sectional view of a display device with an optical reflecting layer, in accordance with one or more embodiments.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Disclosed is a display device for improving the outcoupling of light. The display device may include an OLED display. The display device includes a display panel with pixels and a cover glass with a reflective layer to improve light extraction for the display device. The cover glass includes an overcoat layer with holes and the reflective layer is formed in the holes to reflect light emitted from the pixels towards a viewing surface of the display device.

Light Outcoupling in OLED Displays

In a typical OLED display device, some of the light emitted by an OLED pixel does not exit the display device. For example, light emitted by the OLED pixel incident to a surface of a cover glass of the display device may be reflected back into the display device (e.g., total internal reflection). This occurs when light emitted by the OLED pixel is at a shallow angle to the cover glass surface and can be estimated by using Snell's law. Snell's law describes the relationship between angles of incidence and refraction in two different mediums as shown below in the following equation (1).

$$n_1 \sin \theta_1 = n_2 \sin \theta_2 \quad (1)$$

Here, $n_1$ is the index of refraction of a first medium and $n_2$ is the index of refraction of a second medium, $\theta_1$ is the angle of incidence normal to the surface in the first medium, and $\theta_2$ is the angle of refraction normal to the surface in the second medium. Applied to an OLED display device, light emitted from a sub-pixel may travel through organic material, a cover glass, and air. At each interface, light may be reflected back into the display device.

At the cover glass and air interface, Snell's law can be applied by mapping the first medium to the cover glass and the second medium to air. Total internal reflection occurs when an angle $\theta_2$ is 90 degrees such that the refracted light in the air is directed back to the cover glass. Solving for $\theta_1$ by substituting 1.5 for $n_1$ (index of refraction of glass), 1.0 for $n_2$ (index of refraction of air), and 90 degrees for $\theta_2$ results in $\theta_1$ being around 41.8 degrees.

At the organic material and cover glass interface, Snell's law can further be applied by mapping the first medium to organic material and the second medium to cover glass. Total internal reflection occurs when $\theta_2$ is 41.8 degrees, resulting in light being directed back to the cover glass. Solving for $\theta_1$ by substituting 2.0 for $n_1$ (index of refraction of organic), 1.5 for $n_2$ (index of refraction of glass), and 41.8 degrees for $\theta_2$ results in $\theta_1$ being around 30 degrees. Thus, light emitted by the OLED pixel at an angle within 30 degrees normal to the surface of the cover glass can exit the cover glass, and light emitted by the OLED pixel at an angle greater than 30 degrees normal to the surface of the cover glass would undergo total internal reflection. This angle at which light normal to the surface of the cover glass is reflected may be referred to as a critical angle.

One or more embodiments of the present disclosure includes a reflective layer to improve light outcoupling of the display device by reflecting light emitted by the OLED pixel at angles greater than a critical angle (e.g., angles normal to the surface of the cover glass which would typically undergo total internal reflection in a conventional display device).

Display Device Architecture

FIG. 1 is a cross sectional view of a display device 100 with an optical reflecting layer, in accordance with one or more embodiments. In other embodiments, the display device 100 comprises additional or fewer components than those described herein. Similarly, the functions can be distributed among different entities in a different manner than is described here.

The display device 100 of FIG. 1 includes an upper structure 101 and a lower structure 103. The upper structure 101 is adjoined to the lower structure 103. The optical reflecting layer is included in the upper structure 101 and reflects light from the lower structure 103 to improve the light outcoupling of the display device.

The upper structure 101 includes a cover glass 120, an overcoat layer 122, and a reflective layer 124. The cover glass 120 may be made of materials such as glass or plastic. The cover glass 120 includes a viewing surface 130 which faces a viewing user and an inside surface 131 which faces the pixels of the display device 100.

The overcoat layer 122 covers the inside surface 131 of the cover glass 120. The overcoat layer 122 may be made of acryl or other transparent material. The overcoat layer 122 may have an index of refraction that is the same as the index of refraction of the cover glass 120. For example, the index of refraction of the overcoat layer may be 1.5 and the index of refraction of glass (e.g., cover glass 120) may also be 1.5. Thus, the index of refraction of the overcoat layer and an index of refraction of the cover glass may be identical. The overcoat layer 122 includes a pattern of holes and a reflective layer 124 in the holes. The overcoat layer 122 may be around 2-10 micrometers in thickness. For example, the overcoat layer 122 may be 10 micrometers thick and the holes in the overcoat layer 122 may be around 8 to 9 micrometers in depth. An angle at which a side surface of each of the holes meets a surface of the overcoat layer 122 may be between 60 to 80 degrees.

The reflective layer 124 is an optical reflecting layer that reflects light emitted from the sub-pixels to improve the light outcoupling and efficiency of the display device 100. The reflective layer 124 may be made of metal. The metal may be silver, molybdenum, or aluminum. The reflective layer 124 is on an inside surface 131 of the cover glass 120. The reflective layer 124 may overlap with one or more portions of a black matrix 105 of the display device.

The lower structure 103 includes a substrate 110 with pixels and an encapsulation layer 118. The pixels of the lower structure 103 emits light towards the upper structure 101. In the example of FIG. 1, a single pixel comprising three sub-pixels (e.g., red, green, and blue) is shown. In alternative embodiments, a pixel may include different colors of sub-pixels and different numbers of sub-pixels.

Each sub-pixel includes a first electrode 112, organic material 114, and a second electrode 116. The first electrode 112 and the second electrode 116 are made of conductive materials. The first electrode 112 may include a reflective surface and may be made of a metal. The second electrode 116 may be transparent and may be made of a conductive oxide material or thin layer of metal. The organic material 114 includes an emissive layer for a respective color of a corresponding sub-pixel. The red organic material 114 includes a red emitting layer. The green organic material 114 includes a green emitting layer. The blue organic material 114 includes a blue emitting layer. The organic material 114 may include organic layers such as hole and electron transport layers, charge injection layers, charge blocking layers which may be a same or different material and thickness for a corresponding type of sub-pixel of the display device.

An encapsulation layer 118 covers the sub-pixels. The encapsulation layer 118 may planarize a surface of the lower structure 103 and may protect the sub-pixels from moisture and oxygen. The encapsulation layer 118 may include alternating organic and inorganic layers. For example, a first organic layer on the sub-pixels may planarize the surface of the lower structure 103 and subsequent inorganic and organic layers may serve to protect the sub-pixels from oxygen and moisture. In some embodiments, the encapsulation layer 118 may include a glass surface. The second electrode 116 and the encapsulation layer 118 may have an index of refraction similar to the cover glass 120, organic material 114, or in a range between the cover glass 120 and the organic material 114 (e.g., between 1.5 and 2.0). In another embodiment, there may be no encapsulation layer 118.

In this embodiment, the overcoat layer 122 of the upper structure 101 is directly coupled to the pixels of the lower structure 103. For example, the overcoat layer 122 directly contacts a surface of the lower structure 103 such as an encapsulation layer 118 as shown in FIG. 1. In a different embodiment, the overcoat layer 122 may be separated from the pixels of the lower structure 103 by an air gap.

The display device 100 includes a non-emissive portion between sub-pixels of the display device that may be referred to as a black matrix 105. The reflective layer 124 on the upper structure 101 overlaps the black matrix 105 of the display device. Light 150a from a sub-pixel (e.g., red sub-pixel) reflects off of the reflective layer 124 towards the cover glass 120. The reflected light 150b travels through the overcoat layer 122 and is incident on the inside surface 131 of the cover glass 120. In this embodiment, the overcoat layer 122 and the cover glass 120 may have a similar or same index of refraction. Thus, light 150c continues through the cover glass 120 having little to no refraction and is incident on the viewing surface 130 of the cover glass 120. Light 150d is refracted off of the viewing surface 130 to exit the cover glass to air 140. At least a portion of the exiting light 150e, which is light reflected by the reflective layer 124, overlaps a black matrix 105 of the display device. Thus, a fill factor of the display device can be improved. Further, the light 150a from the sub-pixel may be at an angle which would normally undergo total internal reflection and not exit out of a conventional display device. A display device including an optical reflecting layer such as the reflective layer 124 can reflect the light 150a to exit the display device and improve the light outcoupling and efficiency of the display device 100.

The reflective layer 124 is shaped to receive light emitted from the pixel which is greater than 30 degrees normal to a surface of the cover glass 120. For example, the overcoat layer may be 10 microns in thickness, a hole depth in the overcoat layer may be 9 microns deep, and an angle at which a side surface of each of the holes meet a surface of the overcoat layer may be between 60 to 80 degrees. The thickness of the overcoat layer may be around a same size of an emitting area of a pixel.

In one embodiment, a distance of the reflective layer 124 to a sub-pixel of one color may be different than a distance of the reflective layer 124 to a sub-pixel of another color. The design of a sub-pixel arrangement may be based on light emission efficiencies of each color sub-pixel. For example, in one sub-pixel arrangement, the size of an emitting area for each color sub-pixel may be based on the light emission efficiency of each color sub-pixel. Accordingly, a distance to the reflective layer 124 may also be adjusted to each sub-pixel to compensate for differences in the size of the emitting area for each sub-pixel. In one embodiment, the green sub-pixel may be larger than a distance of the reflective layer to the red sub-pixel or a distance of the reflective layer to the blue sub-pixel of the display device.

Figure 2:
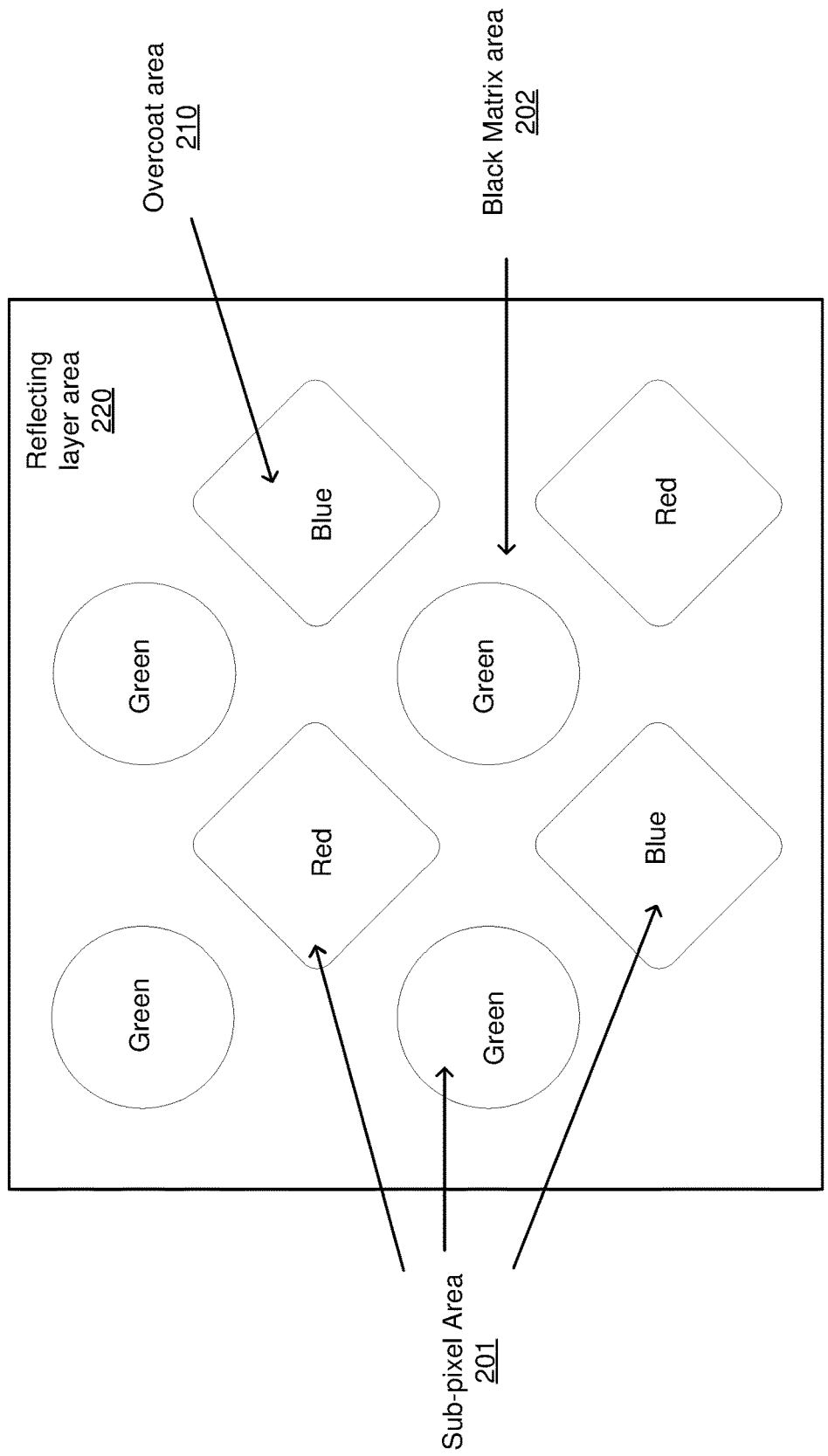
FIG. 2 is a top view of a display device with an optical reflecting layer, in accordance with one or more embodiments.

FIG. 2 is a top view of the display device 100 with an optical reflecting layer, in accordance with one or more embodiments. The display device 100 includes a sub-pixel area 201 and a black matrix area 202. The sub-pixel area 201 corresponds to an area covered by sub-pixels of the display device 100. The black matrix area 202 corresponds to an area covered by a black matrix of the display device 100. The display device 100 also includes an overcoat area 210 and a reflecting layer area 220.

The overcoat area 210 corresponds to an area covered by the overcoat layer and the cover glass that is transparent. The overcoat area 210 overlaps with the sub-pixel area 201.

The reflecting layer area 220 corresponds to an area covered by the optical reflecting layer. The reflecting layer area 220 overlaps with the black matrix area 202. In this embodiment, a shape of a green sub-pixel is round while a shape of the red and blue sub-pixel is rectangular. Other embodiments may have sub-pixels of same shapes or different shapes and sub-pixels of same sizes or different sizes.

FIGS. 3A through 3E illustrates an example process for fabricating the optical reflecting layer on a cover glass of the display device, in accordance with one or more embodiments. This example is merely illustrative, and other processes may be used to form the optical reflecting layer on the cover glass. Likewise, embodiments may include different and/or additional steps, or may perform the steps in different orders.

Figure 3A:
FIGS. 3A, 3B, 3C, 3D, and 3E illustrates an example process for fabricating an optical reflecting layer on a cover glass of a display device, in accordance with one or more embodiments.
Figure 3B:
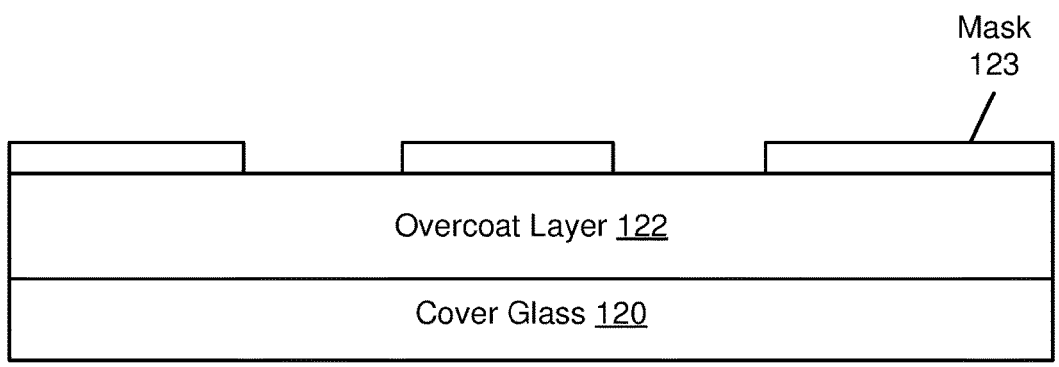
Figure 3C:
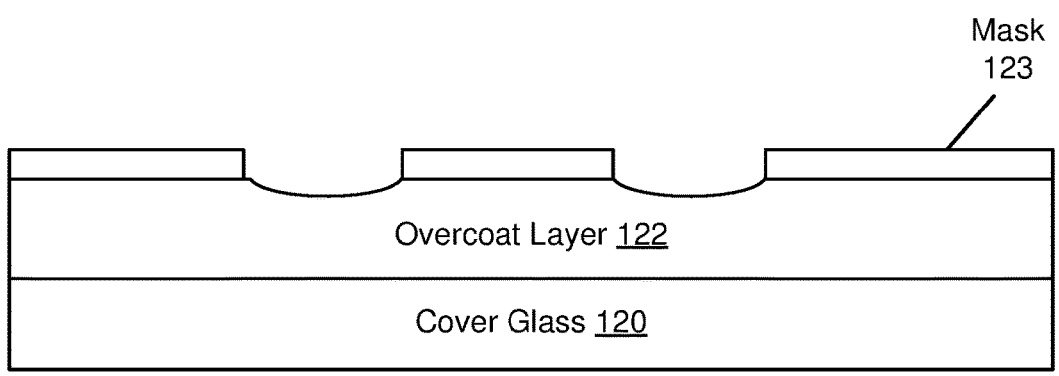
Figure 3D:
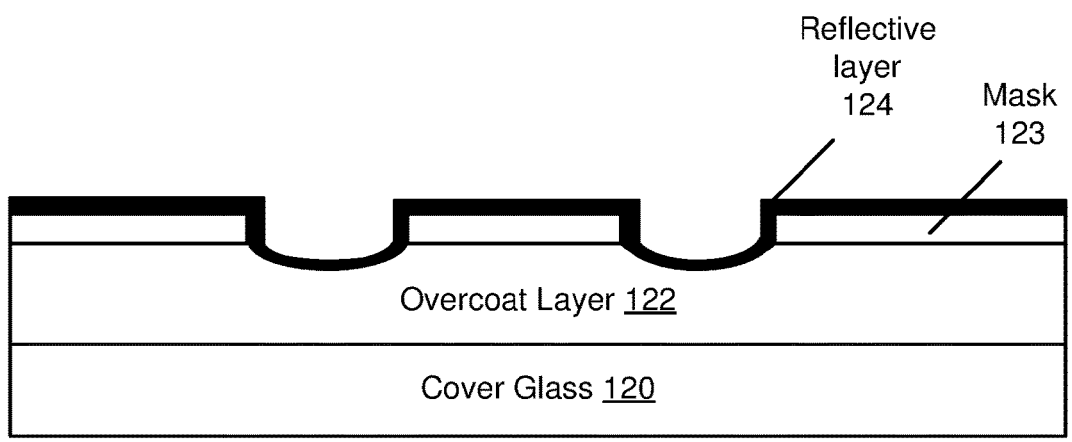
Figure 3E:
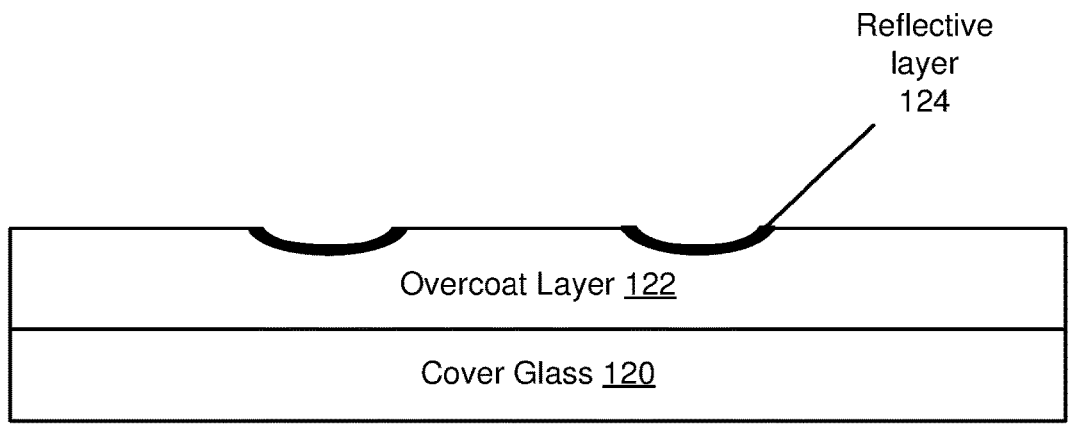

As illustrated in FIG. 3A, an overcoat layer 122 is formed on a cover glass 120. Then, a mask 123 is formed on the overcoat layer 122 as illustrated on FIG. 3B. The mask 123 may be made by depositing the photoresist, exposing the photoresist through a photo mask, and developing the photoresist. The overcoat layer 122 is etched to form holes in the overcoat layer 122, as illustrated in FIG. 3C. A reflective layer 124 is deposited over the overcoat layer 122 and mask 123, as illustrated in FIG. 3D. The mask 123 is removed in a manner such that the reflective layer 124 remains in the holes of the overcoat layer 122 but not on other surfaces of the overcoat layer 122, as illustrated in FIG. 3E. FIGS. 3A to 3E is just one example process, and the optical reflecting layer on a cover glass may be formed with different process steps. For example, instead of a lift-off technique removing mask 123 for patterning the reflective layer 124, the mask 123 may be removed prior to the deposition of the reflective layer 124 and a separate mask and etching may pattern the reflective layer 124 in the holes of the overcoat layer 122.

Figure 4:
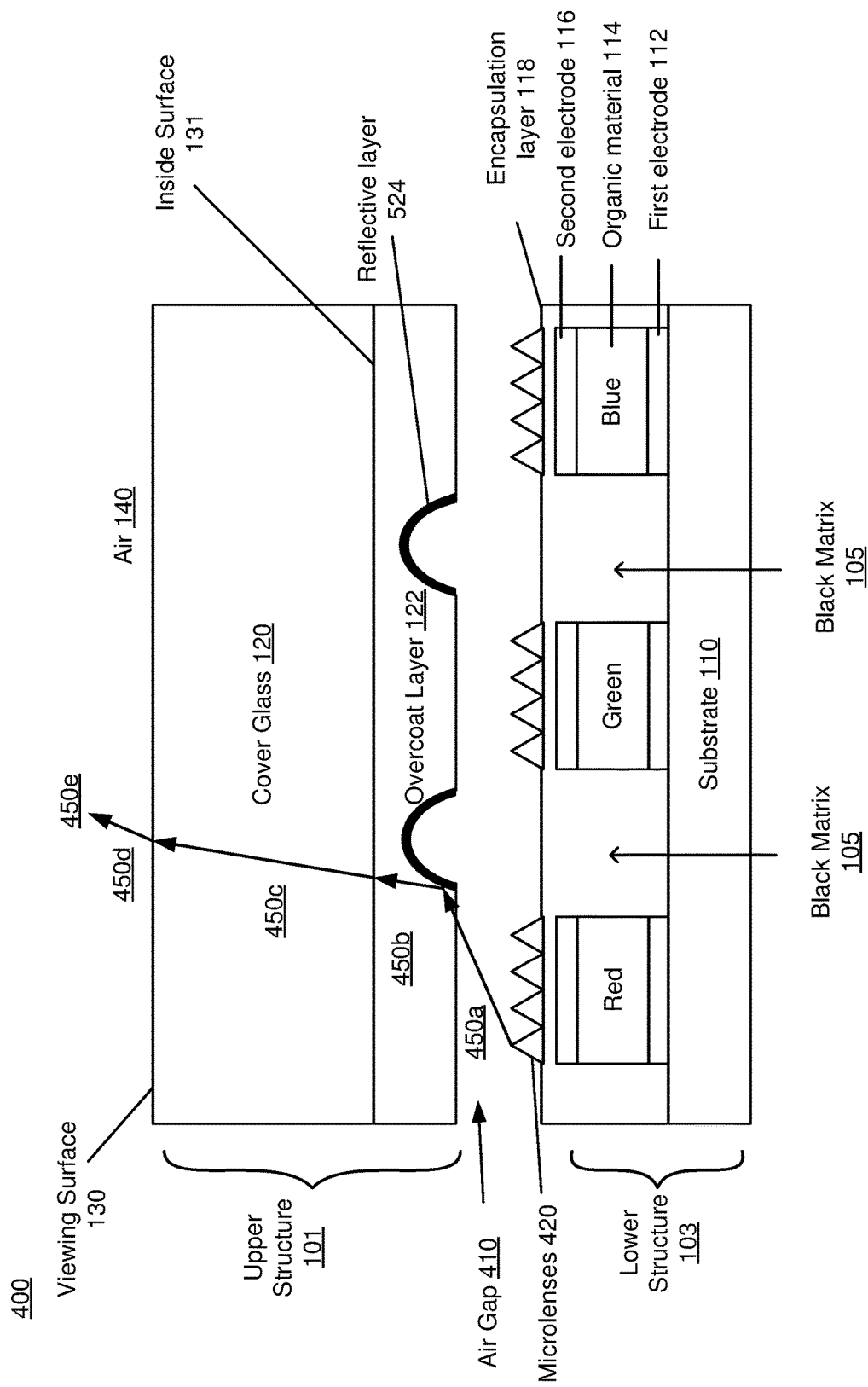
FIG. 4 is a cross section of a display device with microlenses and an optical reflecting layer, in accordance with one or more embodiments.

FIG. 4 is a cross section of a display device 400 with microlenses 420 and an optical reflecting layer 524, in accordance with one or more embodiments. The embodiment of FIG. 4 is similar to the embodiment of FIG. 1 and similar components found in each embodiment have the same label and are not described again for the sake of brevity. The reflective layer 524 is similar to the reflective layer 124, except the difference in the size and the shape (e.g., size and shape of hole in overcoat layer 122 is different). The embodiment of FIG. 4 further comprises microlenses 420 covering each sub-pixel in the lower structure 103 and an air gap 410 separating the upper structure 101 and the lower structure 103. The air gap 410 separating the upper structure 101 and lower structure 103 may be micrometers in size (e.g., 5 micrometers).

The microlenses 420 increase the light outcoupling of the sub-pixels to air (e.g., air gap 410). In this embodiment, the microlenses 420 are coupled to a surface of the lower structure 103. The microlenses 420 are coupled to the encapsulation layer 118 which may include alternating organic and inorganic layers, and may include a glass surface. The microlenses 420 may be made of a plastic or a polymer material (e.g., acryl material). The microlenses 420 may be in a triangular shape with micrometer feature size (e.g., 3 micrometers).

Light 450a from a sub-pixel (e.g., red sub-pixel) reflects off of the reflective layer 524 towards the cover glass 120. The reflected light 450b travels through the overcoat layer 122 and is incident on the inside surface 131 of the cover glass 120. In this embodiment, the overcoat layer 122 and the cover glass 120 may have a similar or same index of refraction. Thus, light 450c continues through the cover glass 120 having little to no refraction and is incident on the viewing surface 130 of the cover glass 120. Light 450d is refracted off of the viewing surface 130 to exit the cover glass to air 140.

At least a portion of the exiting light 450e, which is light reflected by the reflective layer 124, overlaps a black matrix 105 of the display device. Thus, a fill factor of the display device can be improved. Further, the light 450a from the sub-pixel may be at an angle which would normally undergo total internal reflection and not exit out of a conventional display device. A display device including an optical reflecting layer such as the reflective layer 524 can reflect the light 450a to exit the display device and improve the light outcoupling and efficiency of the display device.

The reflective layer 524 may be shaped to receive light emitted from the pixel which is greater than 30 degrees normal to a surface of the cover glass 120. For example, the overcoat layer may be 10 microns in thickness, a hole depth in the overcoat layer may be 9 microns deep, and an angle at which a side surface of each of the holes meet a surface of the overcoat layer may be 80 degrees. The thickness of the overcoat layer may be around a same size of an emitting area of a pixel.

In one aspect, a distance of the reflective layer 524 to the green sub-pixel may be larger than a distance of the reflective layer to the red sub-pixel or a distance of the reflective layer to the blue sub-pixel of the display device.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A display device comprising:
    a lower structure comprising:
        a substrate, and
        a plurality of organic light emitting diode (OLED) pixels on the substrate and configured to emit light towards a viewing surface of the display device; and
    an upper structure adjoined to the lower structure, and comprising:
        a cover glass covering the OLED pixels and comprising the viewing surface,
        an overcoat layer on the cover glass on a surface opposite to the viewing surface, and
        a reflective layer on the overcoat layer and configured to reflect light emitted from one or more OLED pixels towards the viewing surface.

2. The display device of claim 1, wherein the overcoat layer includes holes and wherein the reflective layer overlaps the holes.

3. The display device of claim 2, wherein an angle at which a side surface of each of the holes meets a surface of the overcoat layer is between 60 to 80 degrees.

4. The display device of claim 1, wherein the overcoat layer is coupled directly to the plurality of OLED pixels.

5. The display device of claim 1, wherein the overcoat layer is separated by an air gap from the plurality of OLED pixels.

6. The display device of claim 5, wherein the lower structure further comprises a plurality of microlenses on the plurality of OLED pixels.

7. The display device of claim 1, wherein the reflective layer is a metal.

8. The display device of claim 7, wherein the metal is silver, molybdenum, or aluminum.

9. The display device of claim 1, wherein at least a portion of reflected light exiting the display device from the viewing surface overlaps a portion of a black matrix of the display device.

10. The display device of claim 1, wherein the reflective layer is between an inside surface of the cover glass and the lower structure.

11. The display device of claim 1, wherein the reflective layer overlaps with one or more portions of a black matrix of the display device.

12. The display device of claim 1, wherein an index of refraction of the overcoat layer and an index of refraction of the cover glass are identical.

13. The display device of claim 1, wherein at least one OLED pixel includes a red sub-pixel, a green sub-pixel, and a blue sub-pixel, and wherein a distance of the reflective layer to the green sub-pixel is larger than a distance of the reflective layer to the red sub-pixel or a distance of the reflective layer to the blue sub-pixel of the display device.

* * * * *